(12) United States Patent
Cusin et al.

(10) Patent No.: US 8,563,226 B2
(45) Date of Patent: Oct. 22, 2013

(54) MOULD FOR GALVANOPLASTY AND METHOD OF FABRICATING THE SAME

(75) Inventors: Pierre Cusin, Villars-Burquin (CH); Clare Golfier, La Neuveville (CH); Jean-Philippe Thiebaud, Cudrefin (CH)

(73) Assignee: Nivarox-FAR S.A., Le Locle (CH)

( * ) Notice: Subject to any disclaimer, the term of this patent is extended or adjusted under 35 U.S.C. 154(b) by 392 days.

(21) Appl. No.: 12/723,147

(22) Filed: Mar. 12, 2010

(65) Prior Publication Data

US 2010/0230290 A1 Sep. 16, 2010

(30) Foreign Application Priority Data

Mar. 13, 2009 (EP) .................................. 09155123

(51) Int. Cl.
*C25D 1/00* (2006.01)
*G03C 5/00* (2006.01)
*G03F 7/20* (2006.01)

(52) U.S. Cl.
USPC ............ 430/314; 430/312; 438/708; 205/70; 205/667

(58) Field of Classification Search
None
See application file for complete search history.

(56) References Cited

U.S. PATENT DOCUMENTS

| 5,234,571 | A * | 8/1993 | Noeker ............................ 205/70 |
| 5,529,681 | A * | 6/1996 | Reinecke et al. ................. 205/70 |
| 5,944,974 | A * | 8/1999 | Fahrenberg et al. ............. 205/70 |
| 6,214,245 | B1 | 4/2001 | Hawkins et al. |
| 7,448,277 | B2 | 11/2008 | Gogoi et al. |
| 7,887,995 | B2 * | 2/2011 | Niwa et al. ..................... 430/312 |
| 7,960,090 | B2 * | 6/2011 | Terasaki et al. ............. 430/270.1 |
| 8,021,534 | B2 * | 9/2011 | Niwa et al. ....................... 205/67 |
| 8,148,049 | B2 * | 4/2012 | Murayama et al. ............ 430/311 |
| 2004/0191704 | A1 * | 9/2004 | Nishi et al. ..................... 430/324 |
| 2006/0160027 | A1 | 7/2006 | Niwa et al. |
| 2010/0236934 | A1 * | 9/2010 | Cusin et al. ..................... 205/70 |

FOREIGN PATENT DOCUMENTS

| DE | 40 01 399 C1 | 7/1991 |
| EP | 0 547 371 A1 | 6/1993 |
| EP | 1 462 859 A2 | 9/2004 |
| EP | 1 681 375 A1 | 7/2006 |
| EP | 2 060 534 A1 | 5/2009 |
| JP | 2005-256110 A | 9/2005 |

OTHER PUBLICATIONS

European Search Report issued in corresponding application No. EP09155123, completed Sep. 11, 2009.
Office Action mailed Sep. 24, 2012 in co-pending related U.S. Appl. No. 12/723,191.
Office Action received May 9, 2013 in corresponding Chinese patent application 201010134011.0.

\* cited by examiner

*Primary Examiner* — Zandra Smith
*Assistant Examiner* — Pamela E Perkins
(74) *Attorney, Agent, or Firm* — Griffin & Szipl, P.C.

(57) ABSTRACT

The invention relates to a method (3) of fabricating a mold (39, 39') including the following steps: (a) depositing (9) an electrically conductive layer on the top (20) and bottom (22) of a wafer (21) made of silicon-based material; (b) securing (13) the wafer to a substrate (23) using an adhesive layer; (c) removing (15) one part (26) of the conductive layer from the top of the wafer (21); and (d) etching (17) the wafer as far as the bottom conductive layer (22) thereof in the shape (26) of the one part removed from the top conductive layer (22) to form at least one cavity (25) in the mold. The invention concerns the field of micromechanical parts, particularly, for timepiece movements.

20 Claims, 3 Drawing Sheets

MOULD FOR GALVANOPLASTY AND METHOD OF FABRICATING THE SAME

This application claims priority from European Patent Application No. 09155123.4 filed Mar. 13, 2009, the entire disclosure of which is incorporated herein by reference.

FIELD OF THE INVENTION

The invention relates to a mould for fabricating a micromechanical part using galvanoplasty and the method of fabricating said mould.

BACKGROUND OF THE INVENTION

Galvanoplasty has been used and known for a long time. LIGA type methods (a well know abbreviation for the German term "rontgenLIthographie, Galvanoformung & Abformung") are more recent. They consist in forming a mould by photolithography using a photosensitive resin, and then, by galvanoplasty, growing a metal deposition, such as nickel, therein. The precision of LIGA techniques is much better than that of a conventional mould, obtained, for example, by machining. This precision thus allows the fabrication of micromechanical parts, particularly for timepiece movements, which could not have been envisaged before.

However, these methods are not suitable for micromechanical parts with a high slenderness ratio, such as a coaxial escape wheel made of nickel-phosphorus containing, for example 12% phosphorus. Electrolytic depositions of this type of part delaminate during plating, because of internal stresses in the plated nickel-phosphorus, which cause it to split away at the interface with the substrate.

SUMMARY OF THE INVENTION

It is an object of the present invention to overcome all or part of the aforementioned drawbacks, by proposing an alternative mould that offers at least the same fabrication precision and allows fabrication of parts with several levels and/or a high slenderness ratio.

The invention therefore concerns a method of fabricating a mould that includes the following steps:
a) depositing an electrically conductive layer on the top and bottom of a wafer made of silicon-based material;
b) securing said wafer to a substrate using an adhesive layer;
c) removing one part of said conductive layer from the top of the wafer;
d) etching said wafer as far as the conductive layer on the bottom thereof in the shape of said part removed from the top conductive layer to form at least one cavity in said mould.

According to other advantageous features of the invention:
after step d), the method includes step e): mounting a part on the conductive layer the top of said wafer to form a second level in said mould;
step e) is obtained by structuring a photosensitive resin by photolithography or by securing a pre-etched part made of silicon-based material;
after step d), the method includes step f): mounting a rod in said at least one cavity to form a shaft hole in said part;
the adhesive layer and the conductive layer on the bottom are inverted;
the adhesive layer includes a photosensitive resin;
the substrate includes a silicon-based material;
the method includes step d'): etching the substrate as far as the conductive top layer to form at least one recess in the mould.
after step d'), the method includes step e'): mounting a part on a conductive layer deposited on the top of the substrate to form an additional level in the mould;
after step d'), the method includes step f'): mounting a rod in said at least one hollow to form a shaft hole in the part;
step d) includes the following phases g): structuring a protective mask by photolithography using a photosensitive resin on the portion of the top conductive layer that has not been removed, h): performing an anisotropic etch of the wafer along the parts that are not covered by said protective mask, and i): removing the protective mask;
step d) includes phase h'): performing an anisotropic etch of the wafer using the top conductive layer as a mask to etch the wafer in the parts removed from said conductive layer;
several moulds are fabricated on the same substrate.

The invention also relates to a method of fabricating a micromechanical part by galvanoplasty, characterized in that it includes the following steps:
j) fabricating a mould in accordance with the method of one of the preceding variants;
k) performing an electrodeposition by connecting the electrode to the conductive layer on the bottom of the wafer made of silicon-based material, to form said part in said mould;
l) releasing the part from said mould.

Finally, the invention advantageously relates to a mould for the fabricating of a micromechanical part by galvanoplasty, characterized in that it includes a substrate, a part made of silicon-based material mounted on said substrate and comprising at least one cavity that reveals an electrically conductive surface of said substrate, allowing an electrolytic deposition to be grown in said at least one cavity.

According to other advantageous features of the invention:
the mould has a second part, which is mounted on the first and includes at least one recess that reveals an electrically conductive surface and at least one cavity of said first part for continuing the electrolytic deposition in said at least one recess after said at least one cavity has been filled;
the substrate is formed of a silicon-based material and includes at least one hollow that reveals an electrically conductive surface of said substrate, allowing an electrolytic deposition to be grown in said at least one hollow;
the mould includes an additional part, which is mounted on the substrate and includes at least one recess revealing an electrically conductive surface and at least one hollow in said substrate for continuing the electrolytic deposition in said at least one recess after said at least one hollow has been filled.

BRIEF DESCRIPTION OF THE DRAWINGS

Other features and advantages will appear more clearly from the following description, given by way of non-limiting illustration, with reference to the annexed drawings, in which.

DETAILED DESCRIPTION OF PREFERRED EMBODIMENTS

Figure 8:
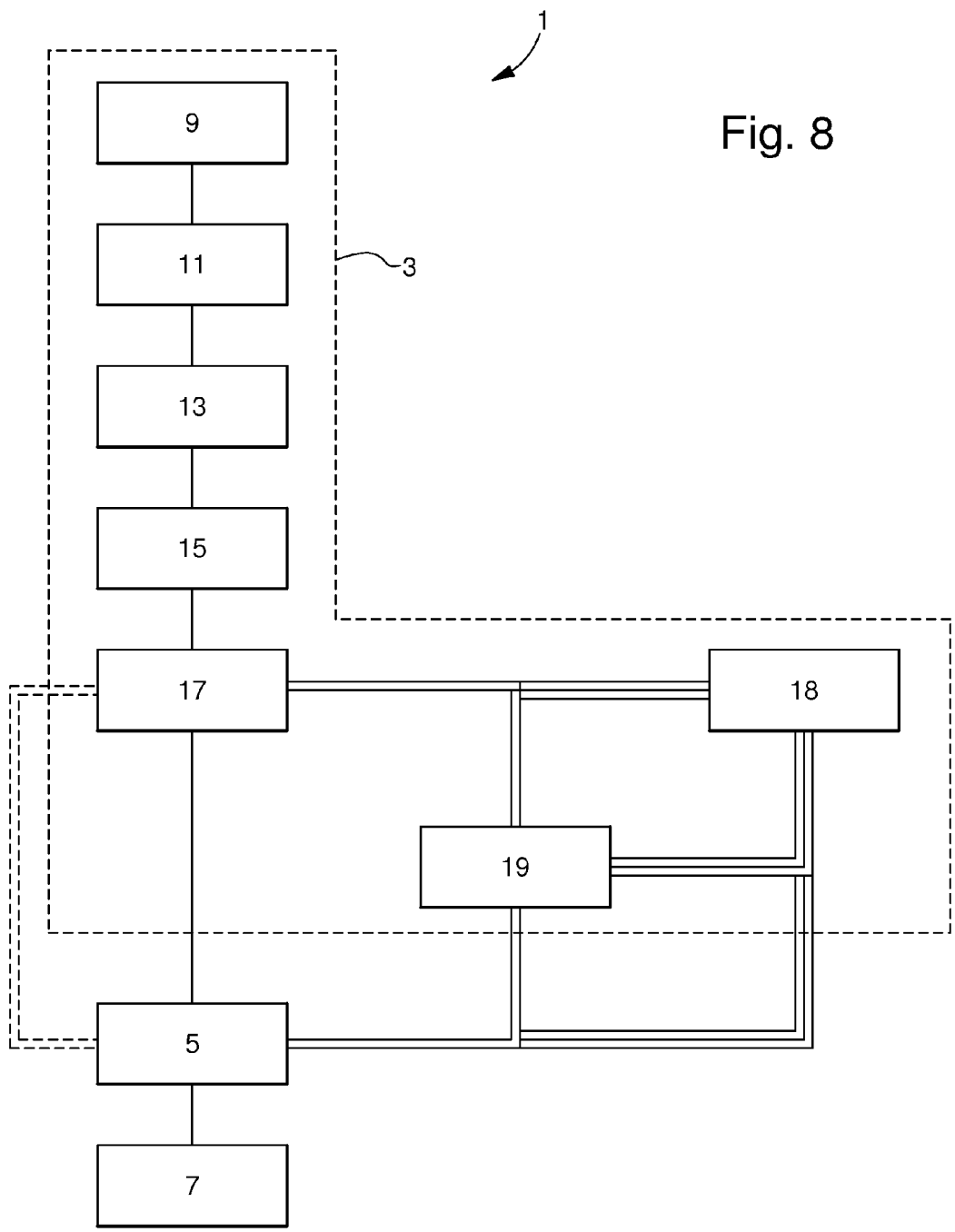
FIG. 8 is a flow chart of a method of fabricating a micromechanical part in accordance with the invention.

As FIG. 8 shows, the invention relates to a method 1 of fabricating a micromechanical part 41, 41' by galvanoplasty. Method 1 preferably includes a method 3 of fabricating a mould 39, 39' followed by galvanoplasty step 5 and step 7 of releasing part 41, 41' from said mould.

Figure 1:
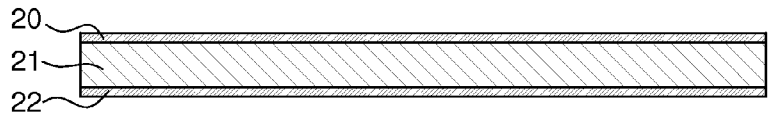
FIGS. 1 to 7 are diagrams of the successive steps of a method of fabricating a micromechanical part in accordance with the invention.

Mould fabrication method 3 includes a series of steps for fabricating a mould 39, 39' that includes at least one part 21 made of silicon-based material. In a first step 9 of method 3, a wafer 21 made of silicon-based material is coated on the top and bottom thereof with electrically conductive layers, respectively referenced 20 and 22 as illustrated in FIG. 1. Conductive layers 20, 22 may include, for example, gold or copper.

Figure 2:
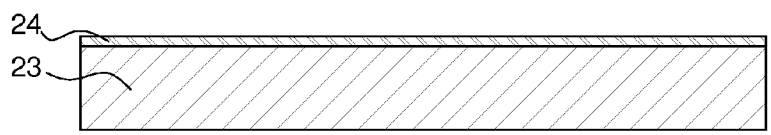

In a second step 11, a substrate 23, which may also be silicon-based, is coated on the top thereof with a layer 24 of adhesive material, as illustrated in FIG. 2. This material may, for example, be a non-activated photosensitive resin or more generally an easily removable photosensitive resin. In the third step 13, adhesive layer 24 is used for at least temporarily securing wafer 21, coated with substrate 23, as illustrated in FIG. 3.

According to an alternative of the invention, the adhesive layer 24 and bottom conductive layer 22 are inverted, as explained below.

Figure 3:
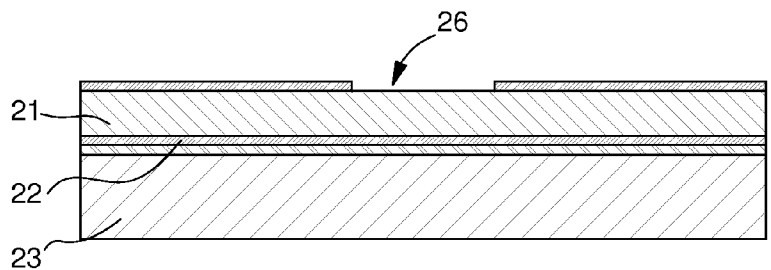

In a fourth step 15, one part 26 of the conductive layer 20 on the top of wafer 21 is removed to reveal part of wafer 21 as illustrated in FIG. 3. In a fifth step 17, wafer 21 is etched until the bottom conductive layer 22 is revealed. According to the invention, etching step 17 is preferably made in the same pattern as part 26 which was removed from conductive layer 20 in step 15.

Etching step 17 preferably includes an anisotropic dry attack of the deep reactive ion etching type (DRIE).

Figure 4:
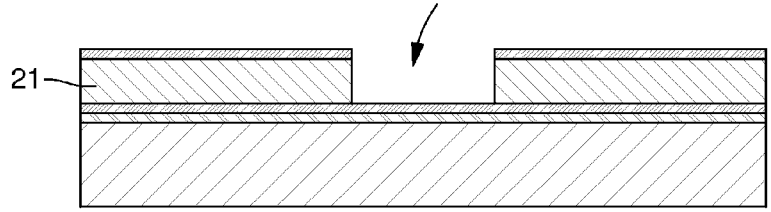

According to a first variant of step 17, the material of the conductive layer 20 on the top of wafer 21 is chosen to act as a protective mask. Thus, when the assembly of mask 20-wafer 21 is subjected to the anisotropic etch, only the unprotected parts 26 of the wafer are etched. At the end of step 17, at least one cavity 25 is thus obtained in wafer 21, the bottom of which partially reveals bottom conductive layer 22 as illustrated in FIG. 4.

According to a second variant of step 17, firstly, a protective mask is coated on wafer 21, preferably in the same shape as removed parts 26 for example, via a photolithographic method using a photosensitive resin. Secondly, when the mask-wafer assembly is subjected to the anisotropic etch, only the unprotected parts of the wafer are etched. Finally, in a third phase, the protective mask is removed. At the end of step 17, at least one cavity 25 is thus obtained in wafer 21, the bottom of which partially reveals the bottom conductive layer 22 as illustrated in FIG. 4.

In the case of the aforecited alternative illustrated in triple lines in FIG. 8, in which adhesion layer 24 and bottom conductive layer 22 are inverted, it is no longer necessary, in a step 18, to continue said cavity 25 into adhesive layer 24 to reveal said bottom conductive layer 22. Preferably, the material used in this alternative is then a photosensitive resin which is exposed to radiation in order to continue cavity 25.

After step 17, the invention provides two embodiments. In a first embodiment, illustrated in a single line in FIG. 8, after step 17, mould fabricating method 3 is finished and micromechanical part fabricating method 1 continues immediately with galvanoplasty step 5 and step 7 of releasing the part from said mould. Galvanoplasty step 5 is achieved by connecting the deposition electrode to bottom conductive layer 22 of wafer 21 so as to grow, firstly, an electrolytic deposition in cavity 25 of said mould, and then in step 7, the part formed in cavity 25 is released from said mould.

According to this first embodiment, it is clear that the micromechanical part obtained has a single level whose shape is identical throughout the entire thickness thereof.

According to a second embodiment of the invention, illustrated in double lines in FIG. 8, step 17 is followed by step 19 for forming at least one second level in mould 39. Thus, the second level is achieved by mounting a part 27 on one part of the top conductive layer 20, which was not removed in step 15.

Part 27 is preferably formed on conductive layer 20 in a recess 28 of larger section than the removed parts 26, for example, via a photolithographic method using a photosensitive resin.

Figure 5:
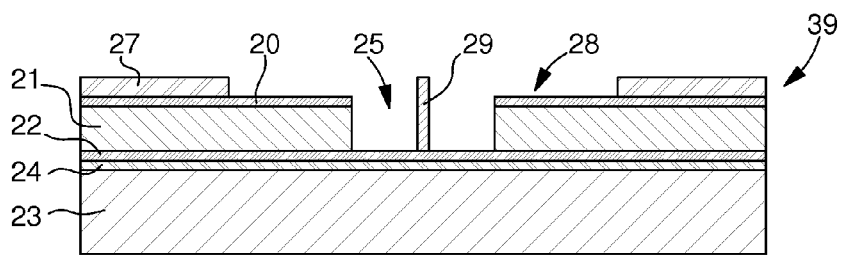

Moreover, as illustrated in FIG. 5, in step 19, a rod 29 is preferably mounted to form shaft hole 42 for micromechanical part 41 straight away during the galvanoplasty. This not only has the advantage of meaning that part 41 does not need to be machined once the galvanoplasty has finished, but also means that an internal section of any shape can be formed, whether uniform or not, over the entire height of hole 42. Rod 29 is preferably obtained in step 19 at the same time as part 27, for example, via a photolithographic method using a photosensitive resin.

In the second embodiment, mould 39 fabrication method 3 ends after step 19, and the micromechanical part fabrication method 1 continues with galvanoplasty step 5 and step 7 of releasing the part from said mould.

Figure 6:
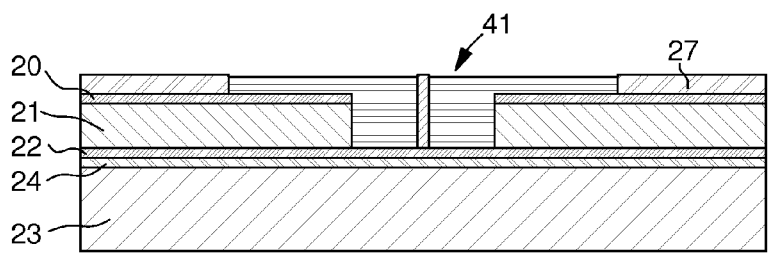

Galvanoplasty step 5 is achieved by connecting the deposition electrode to conductive layer 22 on the bottom of wafer 21, firstly, to grow an electrolytic deposition in cavity 25 of said mould, and then, exclusively in a second phase, in recess 28, as illustrated in FIG. 6.

Indeed, advantageously according to the invention, when the electrolytic deposition is flush with the top part of cavity 25, it electrically connects conductive layer 20, which enables the deposition to continue to grow over the whole of recess 28. Advantageously, the invention allows fabrication of a part with a high slenderness ratio, i.e. wherein the section of cavity 25 is much smaller than that of recess 28, avoiding delamination problems even with a nickel-phosphorus material containing, for example, 12% phosphorus.

Owing to the use of silicon under conductive layer 20, delamination phenomena at the interfaces decrease, which avoids splitting, caused by internal stresses in the electrodeposited material.

Figure 7:
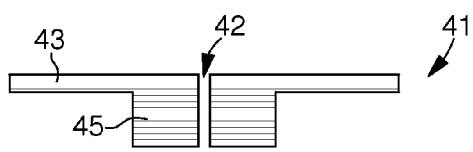

According to the second embodiment, fabrication method 1 ends with step 7, in which the part 41 formed in cavity 25 and then in recess 28 is released from mould 39. Release step 7 could, for example be achieved by delaminating layer 24 or by etching substrate 23 and wafer 21. According to this second embodiment, it is clear, as illustrated in FIG. 7, that the micromechanical part 41 obtained has two levels 43, 45, each of different shape and perfectly independent thickness.

This micromechanical part 41 could, for example, be a coaxial escape wheel, or escape wheel 43-pinion 45 assembly with geometrical precision of the order of a micrometer, but also ideal referencing, i.e. perfect positioning between said levels.

According to second variant of method 1 illustrated by a double dotted lines in FIGS. 1 to 5 and 8 to 13, it is possible to add at least a third level to mould 39. The second variant remains identical to method 1 described above as far as step 17, 18 or 19, depending upon the alternative or variant used. In the example illustrated in FIGS. 9 to 13, we will take the second embodiment as illustrated in double lines in FIG. 8, as the starting point.

Preferably, according to this second variant, substrate 23 is formed from a silicon-based material and is etched to form a hollow 35 in mould 39'.

Figure 9:
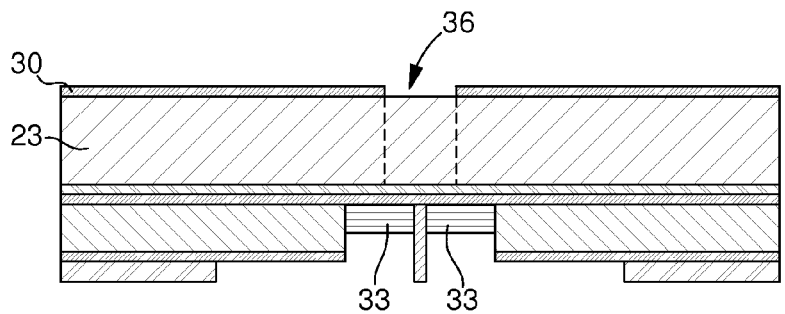
FIGS. 9 to 13 are diagrams of the final successive steps of a method of fabricating a micromechanical part in accordance with the invention.

As can be seen, preferably between FIG. 5 and FIG. 9, a deposition 33 has been performed in one part of the first cavity 25 to provide a conductive layer that is thicker than layer 22 alone, for the purpose of mechanically withstanding the steps of the second variant of method 1. Preferably, this deposition 33 is performed by starting step 5 up to a predetermined thickness. However, this deposition can be performed in accordance with a different method.

As illustrated in double dotted lines in FIG. 8, the second variant of method 1 applies steps 17, 18 and/or 19 of the end of method 3 to substrate 23. Thus, in the new step 17, substrate 23 is etched until conductive layer 22 is revealed. Etch step 17 preferably includes deep reactive ion etching (DRIE).

Preferably, firstly, as illustrated in FIG. 9, a protective mask 30 is coated on substrate 23, comprising pierced parts 36 for example, via a photolithographic method using a photosensitive resin. Secondly, the mask 30-substrate 23 assembly is subjected to the anisotropic etch, with only the unprotected parts of the substrate being etched.

Figure 10:
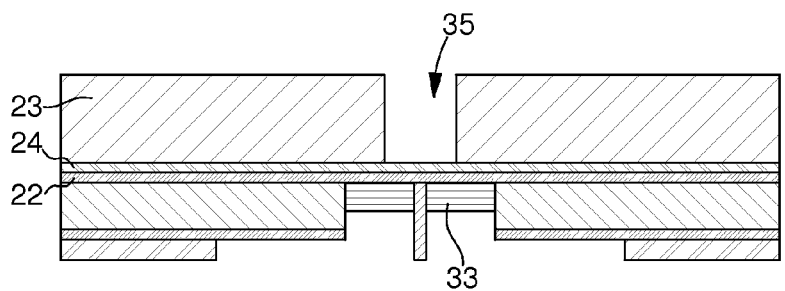

Thirdly, protective mask 30 is removed. At least one hollow 35 is thus obtained in substrate 23, the bottom of which partially reveals adhesive layer 24, as illustrated in FIG. 10. Finally, fourthly, hollow 35 is extended into layer 24 and, possibly, also into layer 22. The material used for adhesive layer 24 is preferably a photosensitive resin which is exposed to radiation to continue hollow 35. At the end of step 17, at least one hollow 35 is thus obtained in substrate 23, the bottom of which partially reveals conductive layer 22 or, possibly, deposition 33.

Of course, in a similar way to that explained above, a conductive layer can also be deposited on substrate 23 instead of photostructured resin mask 30, the material of which is chosen so that it can act as protective mask.

Likewise, in the case of the aforecited alternative in which adhesive layer 24 and bottom conductive layer 22 are inverted, it is no longer necessary to continue said hollow 35 into adhesive layer 24 to reveal conductive layer 22 or, possibly, deposition 33.

After step 17 of the second variant of method 1, the invention can also provide the two aforecited embodiments, i.e. continuing with galvanoplasty step 5 and release step 7, or continuing with a step 19 to form at least one additional level on substrate 23. To simplify the Figures, FIGS. 11 to 13 are realised from the first embodiment.

Figure 11:
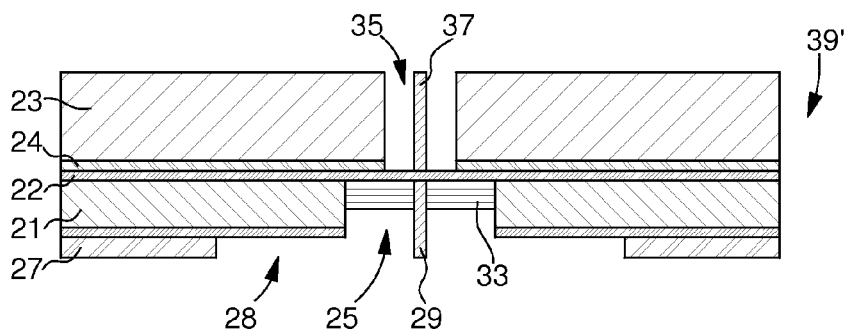

Preferably, whichever embodiment is chosen, as illustrated in FIG. 11, a rod 37 is mounted to form hole 42' for micromechanical part 41' immediately during the galvanoplasty. Preferably, if rods 29 and 37 are formed respectively in cavity 25 and hollow 35, they are aligned. Preferably, rod 37 is obtained, for example, via a photolithographic method using a photosensitive resin.

Figure 12:
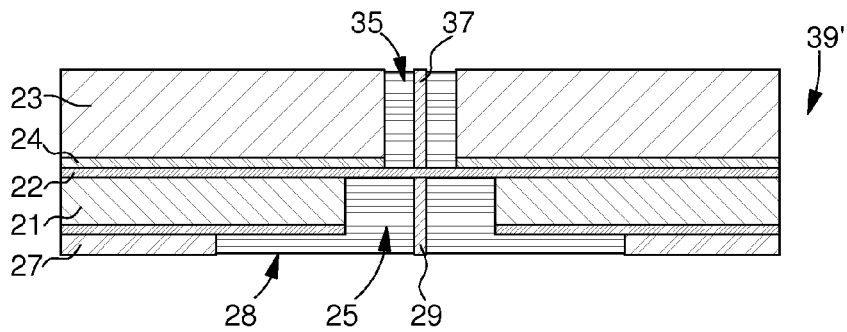

After the new steps 17 or 19, galvanoplasty step 5 is performed by connecting the deposition electrode to conductive layer 22 to grow an electrolytic deposition in hollow 35, but also to continue the growth of deposition 33 in cavity 25, and then, exclusively in a second phase, in recess 28, as illustrated in FIG. 12. Fabrication method 1 ends with step 7, in which part 41' is released from mould 39' as explained above.

Figure 13:
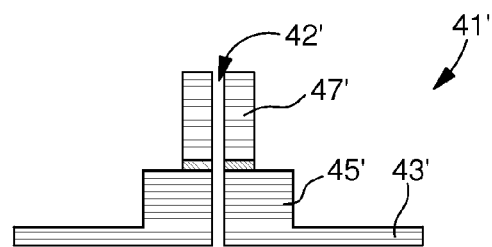

According to this second variant, it is clear, as illustrated in FIG. 13, that the micromechanical part 41' obtained has at least three levels 43', 45' and 47', each of different shape and perfectly independent thickness, with a single shaft hole 42'.

This micromechanical part 41' could, for example, be a coaxial escape wheel 43', 45' with its pinion 47', or a wheel set with three levels of teeth 43', 45', 47' with geometrical precision of the order of a micrometer, but also ideal referencing, i.e. perfect positioning between said levels.

Of course, the present invention is not limited to the example illustrated, but is open to various alterations and variants, which will be clear to those skilled in the art. In particular, part 27 could include a pre-etched silicon-based material, and then be secured to conductive layer 20.

Moreover, several moulds 39, 39' are fabricated from the same substrate 23 to achieve series fabrication of micromechanical parts 41, 41', which are not necessarily identical to each other.

Likewise, a rod 29 can be formed in cavity 25 to form a shaft hole 42 for the future part 41, even within the scope of the first, single level embodiment. One could also envisage changing silicon-based materials for crystallised alumina or crystallised silica or silicon carbide.

Finally, layer 20 formed in step 9, and then partially pierced in step 15, can also be obtained via a single, selective, deposition step 15. This step 15 could then consist, firstly, in depositing a sacrificial layer in the same shape as section 26, prior to deposition of conductive layer 20. Secondly, a conductive layer 20 is deposited on top of the assembly. Finally, in a third phase, the sacrificial layer is removed and, incidentally, the conductive layer part deposited thereon, which provides the same layer 20 as that visible in FIG. 3. This step 15 is known as "lift-off".

What is claimed is:

1. A method of fabricating a mould including the following steps of:
   (a) depositing an electrically conductive layer on a top and a bottom of a wafer made of silicon-based material;
   (b) securing the wafer to a substrate using an adhesive layer;
   (c) removing one part of the conductive layer from the top of the wafer; and
   (d) etching the wafer as far as the conductive layer on the bottom thereof in the shape of the one part removed from the conductive layer on the top thereof to form at least one cavity in the mould.

2. The method according to claim 1, wherein, after step (d), the method further includes the following step of:
   (e) mounting a first part on the conductive layer on the top of said wafer to form a second level in said mould.

3. The method according to claim 2, wherein step (e) is obtained by structuring a photosensitive resin by photolithography.

4. The method according to claim 2, wherein step (e) is obtained by securing the first part made of pre-etched, silicon-based material on the conductive layer on the top of said wafer to form the second level in said mould.

5. The method according to claim 1, wherein, after step (d), the method further includes the following step of:
   (e) forming a rod by photolithography in said at least one cavity to form a shaft hole in the wafer.

6. The method according to claim 1, wherein the adhesive layer and the bottom conductive layer are inverted.

7. The method according to claim 1, wherein the adhesive layer includes a photosensitive resin.

8. The method according to claim 1, wherein the substrate includes a silicon-based material.

9. The method according to claim 8, wherein the method includes the following step of:
(e) etching the substrate as far as the bottom conductive layer to form at least one hollow in the mould.

10. The method according to claim 9, wherein, after step (e), the method further includes the following step of:
'(f) mounting a first part on a conductive layer deposited on the bottom of the substrate to form an additional level in the mould.

11. The method according to claim 9, wherein, after step (e), the method further includes the following step of:
'(f) forming a rod in said at least one hollow to form a shaft hole in the wafer.

12. The method according to claim 1, wherein in that step (d) includes the following sub-steps of:
(i) structuring a protective mask by photolithography using a photosensitive resin on a portion of the top conductive layer that has not been removed;
(ii) performing an anisotropic etch of the wafer on second parts of the conductive layer not coated by said protective mask; and
(iii) removing the protective mask.

13. The method according to claim 1, wherein step (d) includes the following sub-step of:
'(i) performing an anisotropic etch of the wafer using the top conductive layer as a mask to etch the wafer in second parts removed from said conductive layer.

14. The method according to claim 1, wherein several moulds are fabricated from the same substrate.

15. A method of fabricating a micromechanical part by galvanoplasty, wherein the method includes the following steps of:
fabricating a mould according to the method of claim 1;
performing an electrodeposition by connecting an electrode to the conductive layer on the bottom of the wafer made of silicon-based material to form a second part in the mould;
releasing the second part from the mould.

16. A mould for fabricating a micromechanical part by galvanoplasty, wherein the mould includes:
(a) a substrate;
(b) an adhesive layer coating the substrate;
(c) an electrically conductive layer coated on the adhesive layer to form a first electrically conductive surface on the substrate; and
(d) a first part made of silicon-based material, wherein the first part is mounted on the substrate and includes at least one cavity that reveals the electrically conductive surface on the substrate thereby enabling an electrolytic deposition to be grown in the at least one cavity.

17. The mould according to claim 16, wherein the mould further includes:
(e) a second part that is mounted on the first part and that includes at least one recess that reveals an electrically insulating surface and that reveals the at least one cavity in the first part, wherein the second part enables continuing of the electrolytic deposition in said at least one recess after said at least one cavity has been filled.

18. The mould according to claim 16, wherein the substrate is formed of a silicon-based material and has at least one hollow that reveals the electrically conductive surface on said substrate, thereby enabling an electrolytic deposition to be grown in said at least one hollow.

19. The mould according to claim 18, wherein the mould further includes:
(e) an additional part that is mounted on the substrate and that includes at least one recess revealing the electrically conductive surface and at least one hollow in said substrate, wherein the additional part enables continuing of the electrolytic deposition in said at least one recess after said at least one hollow has been filled.

20. The mould according to claim 17, wherein the substrate is formed of a silicon-based material and has at least one hollow that reveals the electrically conductive surface on said substrate, thereby enabling an electrolytic deposition to be grown in said at least one hollow.

* * * * *